United States Patent
Picard et al.

(10) Patent No.: US 7,112,829 B2
(45) Date of Patent: Sep. 26, 2006

(54) LIGHT EMITTING DEVICE AND METHOD FOR MAKING SAME

(75) Inventors: Emmanuel Picard, Saint Martin d'Uriage (FR); Emmanuel Hadji, Fontaine (FR); Jean-Paul Zanatta, Grenoble (FR)

(73) Assignee: Commissariat a l'Energie Atomique, Paris (FR)

( * ) Notice: Subject to any disclaimer, the term of this patent is extended or adjusted under 35 U.S.C. 154(b) by 0 days.

(21) Appl. No.: 10/467,716

(22) PCT Filed: Dec. 12, 2002

(86) PCT No.: PCT/FR02/04330

§ 371 (c)(1),
(2), (4) Date: Aug. 12, 2003

(87) PCT Pub. No.: WO03/050887

PCT Pub. Date: Jun. 19, 2003

(65) Prior Publication Data

US 2004/0061117 A1  Apr. 1, 2004

(30) Foreign Application Priority Data

Dec. 13, 2001 (FR) .................................. 01 16116

(51) Int. Cl.
*H01L 31/0328* (2006.01)
*H01L 33/00* (2006.01)
*H01L 31/00* (2006.01)

(52) U.S. Cl. .......................... 257/188; 257/86; 257/98; 257/103; 257/442

(58) Field of Classification Search ................. 257/13, 257/21, 98, 79–86, 103, 183–184, 188, 190, 257/436, 440–442, 22, 29, 48; 438/93–94
See application file for complete search history.

(56) References Cited

U.S. PATENT DOCUMENTS 5,068,524 A * 11/1991 Elliott et al. ................ 257/188
5,457,331 A * 10/1995 Kosai et al. ................ 257/188
6,111,266 A * 8/2000 Carline et al. ................ 257/14

FOREIGN PATENT DOCUMENTS

GB  2165089 A * 4/1986
JP  06 314845  11/1994

OTHER PUBLICATIONS

B. Corbett et al.: "Resonant cavity light emitting diode and detector using epitaxial liftoff" IEEE Photonics Technology Letters, IEEE Inc., vol. 5, No. 9, pp. 1041-1135 Sep. 1, 1993.

(Continued)

*Primary Examiner*—Ori Nadav
(74) *Attorney, Agent, or Firm*—Oblon, Spivak, McClelland, Maier & Neustadt, P.C.

(57) ABSTRACT

A light emission device and method for producing the device. The device includes, on a substrate, a stack including an etching stop layer, a first barrier layer, an emitting layer, and a second barrier layer. The stop layer is of the same nature as the emitting layer. One may form a mirror on the stack, eliminate the substrate by etching, and form another mirror on the stop layer to obtain a micro-cavity. The device may be applied in particular to the detection of gas.

16 Claims, 3 Drawing Sheets

OTHER PUBLICATIONS

C. Roux et al.: "II-VI infrared microcavity emitters with 2 postgrowth dielectric mirrors" Journal of Crystal Growth, vol. 201-202, pp. 1036-1039 May 1999.

E. Hadji et al.: "3.2 μm Infrared resonant cavity light emitting diode" Appl. Phys. Lett., vol. 67, No. 18, pp. 2591-2593 Oct. 30, 1995.

P. Ferret: "3-3- μm microcavity light emitter for gas detection" Optics Letters, vol. 25, No. 10, pp. 725-757 May 15, 2000.

Kenichi Iga et al.: "Surface emitting semiconductor lasers" IEEE Journal of Quantum Electronics, vol. 24, No. 9, pp. 1845-1855, Sep. 1998.

\* cited by examiner

LIGHT EMITTING DEVICE AND METHOD FOR MAKING SAME

TECHNICAL FIELD

The present invention concerns a micro-cavity light emitting device and a method for producing said device.

More specifically, the invention concerns a micro-cavity light emitting device that emits light in the mid infrared, which extends from 2 µm to 6 µm, and a method for producing said device.

The invention applies, in particular:

- to the detection of gases such as polluting gases or greenhouse effect gases, more specifically in the field of the automobile industry (measuring the concentration of exhaust gases) and in the field of climatology (measuring the carbon dioxide in the atmosphere), and
- to the automatic sorting of plastics that also absorb in the infrared at different wavelengths according to their composition.

STATE OF THE PRIOR ART

A micro-cavity light emitting device is a planar type of device, comprising an emitting structure that one photo-pumps by means of a laser diode.

Said emitting structure comprises an active part based on semi-conductor materials, which is inserted into a micro-cavity. Said micro-cavity is delimited by two dielectric mirrors (for example, two Bragg mirrors) which are added on the active part.

The assembly comprising the micro-cavity and the two mirrors stands on a mechanical support.

The length of the micro-cavity is very short, around several demi-wavelengths, and determines the wavelength of the emitted light.

Said type of device makes it possible to only have a single resonant mode at the selected wavelength.

With regard to such devices, which emit in the mid infrared range, the reader may refer, for example, to the following document:

E. Hadji et al, Optics Lett., Vol. 25, No. 10, 2000, pp. 725–727.

Several techniques for producing said type of micro-cavity component are known.

According to a first known technique, the active part is epitaxied directly on a crystalline substrate. Then, the first of two mirrors is deposited directly on said active part but the second mirror may only be deposited after local ablation of the substrate.

In this respect, the reader may refer, for example, to the following document:

K. Iga et al, IEEE J. of Quant. Electr., Vol. 24, No. 9, 1998, pp. 1845–1853.

This known technique requires the use of a stop layer for the etching of the substrate, whereby said etching must stop at the interface between the substrate and the active, epitaxied part on said substrate.

This technique may be used with silicon and III–V semi-conductors but such materials emit at wavelengths below 1.5 µm. In order to be able to work in the mid infrared range (which extends from 3 µm to 6 µm), materials based on mercury or antimony must be used.

One may then reproduce the etching technique of the substrate but with a stop layer adapted to the materials used, for example an HgTe stop layer.

The ablation of the substrate must be carried out with extreme precision because it must be stopped at the interface between the substrate and the epitaxied structure on said substrate. To do this, one uses a chemical etching method which allows a selective attack as a function of the material. In order to eliminate the substrate, one again provides a stop layer which stops the chemical attack of the substrate.

Said elimination of the substrate is based on the fact that there is a great selectivity of chemical attack between CdTe and HgTe. In the case of micro-cavity infrared emitters, HgTe is therefore a good stop material. However, a stop layer in HgTe is very absorbent and significantly reduces the optical efficiency of the micro-cavity.

According to a second known technique, the active part is epitaxied on a crystalline mirror of the same nature, itself epitaxied on a substrate that mechanically supports the whole of the structure.

In this respect, the reader may refer, for example, to the following document:

E. Hadji et al., Appl. Phys. Lett., Vol. 67, No. 18, 1995, pp. 2591–2593.

The production of said mirror takes a long time, due to the low rate of crystalline growth. Moreover, the epitaxy requires the crystalline parameter of the different layers of the mirror to be attuned, which limits the choice of materials that can be used.

DESCRIPTION OF THE INVENTION

The aim of the present invention is to overcome the disadvantages of said known techniques.

More precisely, the aim of the invention is a light emitting device comprising a stack that comprises:

a substrate,
an etching stop layer on said substrate,
a first barrier layer on said stop layer,
a light emitting layer on said first barrier layer, and
a second barrier layer on said emitting layer, said device being characterised in that the etching stop layer and the emitting layer are in $Cd_xHg_{1-x}Te$.

A further aim of the invention is a method for producing a light emitting device, said device comprising an active part and a micro-cavity, delimited by first and second mirrors and containing the active part, said active part being formed on a substrate and comprising an etching stop layer at the interface of said active part with the substrate, and an emitting layer suited to emitting light when it is optically pumped through the first mirror, method in which one forms the first mirror on the active part, one eliminates the substrate by etching, and one forms the second mirror on the active part, said method being characterised in that the emitting layer is made out of a material suited to emitting light and also to stopping the etching and the etching stop layer is made out of said material.

According to a preferred embodiment of the method according to the invention, the etching is a chemical etching.

According to a specific embodiment of the method according to the invention, the elimination of the substrate comprises in addition a polishing of said substrate before the etching of said substrate.

Preferably, the material of the emitting layer is chosen so that the light emitted by said emitting layer is an infrared radiation whose wavelength is in the range extending from 2 µm to 6 µm.

In this case, the material of the emitting layer and the etching stop layer is $Cd_xHg_{1-x}Te$.

According to a preferred embodiment of the invention, the thickness of the etching stop layer is less than 50 nm.

One may fasten the first mirror to a support which is transparent to the optically pumped light.

Due to the fact that the etching stop layer has the same composition as the emitting layer, said device has advantages:

Not only are the photons emitted by said emitting layer not absorbed by the etching stop layer, but said stop layer participates in the light emission induced by optical pumping.

The efficiency of the device according to the invention is thus higher than that of known micro-cavity devices.

BRIEF DESCRIPTION OF THE DRAWINGS

The present invention will be more fully understood on reading the description of embodiments given hereafter, by way of indication and in nowise limitative, and by referring to the appended drawings in which FIGS. 1 to 5 schematically illustrate the steps of one specific embodiment of the method according to the invention.

DETAILED DESCRIPTION OF SPECIFIC EMBODIMENTS

Figure 1:
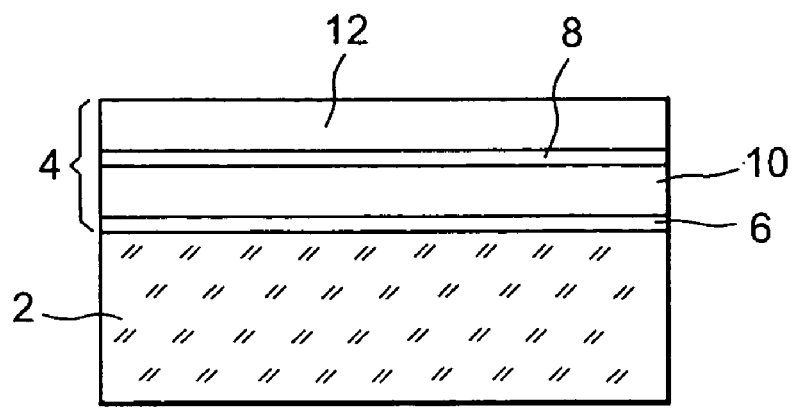

In order to implement said example of the method according to the invention, one begins by forming, on a substrate (2) (FIG. 1), an emitting structure, suited to generating an infrared radiation when it is optically pumped.

Said emitting structure comprises an active part 4 and a micro-cavity which is delimited by two mirrors (which will be discussed hereafter) and contains the active part 4.

Said active part is a stack comprising:

a layer 6 forming an etching stop layer of the substrate and located at the interface of the active part and the substrate and thus in contact with said substrate, a well layer forming an emitting layer 8, suited to emitting infrared radiation when it is optically pumped through one of the mirrors, or base mirror, and first and second barrier layers 10 and 12.

In accordance with the invention, the emitting layer 8 is formed from a material which is both suited to emitting infrared radiation and suited to stopping the etching of the substrate 2 and the etching stop layer 6 is formed of said material.

In the example of FIG. 1, the substrate 2 is in CdZnTe and has a thickness of 750 μm, the emitting layer 8 is in $Cd_xHg_{1-x}Te$ and each of the barrier layers is in $Cd_yHg_{1-y}Te$, where y>x, and the etching stop layer 6 is also in $Cd_xHg_{1-x}Te$.

One sets the composition of the emitting layer, and thus the value of x, as a function of the wavelength λ of the radiation to emit (resonance wavelength of the micro-cavity).

Preferably, one chooses x and y so that:

0.1<x<0.5 and 0.6<y<1.

Purely by way of indication and in nowise limitative, x is equal to 0.31 and y to 0.65.

The thickness of the active part 4 (stack of the assembly of layers 6 to 12) is preferably between λ/(2n) and 10λ/(2n) and equals, for example, λ/n, where n is the average refractive index of the stack 4 of layers 6, 8, 10 and 12.

The thickness of the etching stop layer 6 is as low as possible, preferably below 50 nm, and equals for example 35 nm.

Said etching stop layer in $Cd_xHg_{1-x}Te$ participates in the emission of infrared radiation without absorbing said radiation.

One thus increases significantly the optical efficiency of the device compared to that of devices of the prior art.

In order to form the emitting structure, on forms firstly, by epitaxy, the stack of layers 6 to 12 on the substrate 2.

Figure 2:
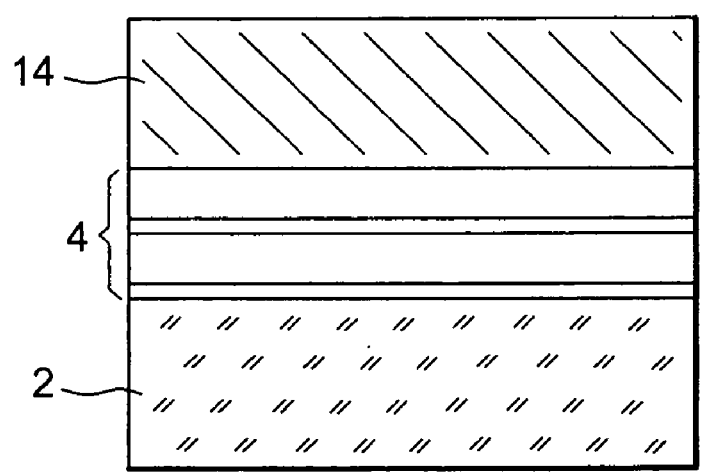

One then forms, on the layer 12, a Bragg mirror 14 (FIG. 2) called "base mirror", in which the reflectivity (towards the radiation generated by the active part) is very high and for example equal to 98%.

Figure 3:
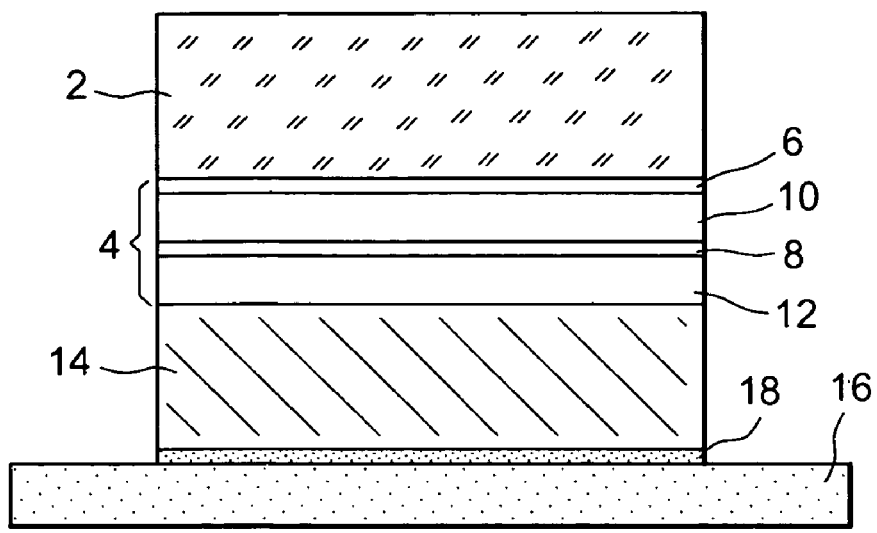

One then bonds said base mirror 14 onto a support formed of a plate of silicon 16 (FIG. 3) whose thickness equals for example 300 μm, by means of a bonding layer in epoxy resin 18 which is transparent to the light intended for the optical pumping of the emitting structure.

Figure 4:
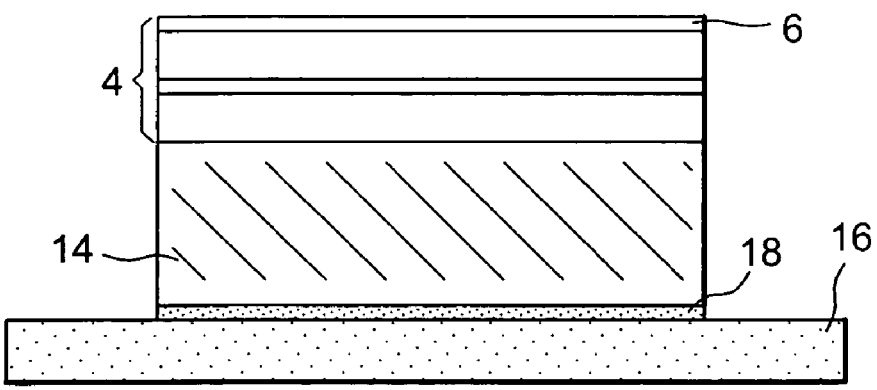

One then eliminates the substrate 2. One begins by removing 600 μm of said substrate by mechanical polishing. One then chemically etches the remaining 150 μm (FIG. 4). In order to do this, one uses a selective chemical etching which eliminates the material of the substrate 2 and stops at the layer 6.

Said etching is carried out by means of a mixture of acids. In the example where the substrate is in CdZnTe, one uses a solution based on hydrofluoric acid, nitric acid and acetic acid.

In order to obtain said solution, one mixes for example 1 volume of hydrofluoric acid, 1 volume of nitric acid and 4 volumes of acetic acid.

Figure 5:
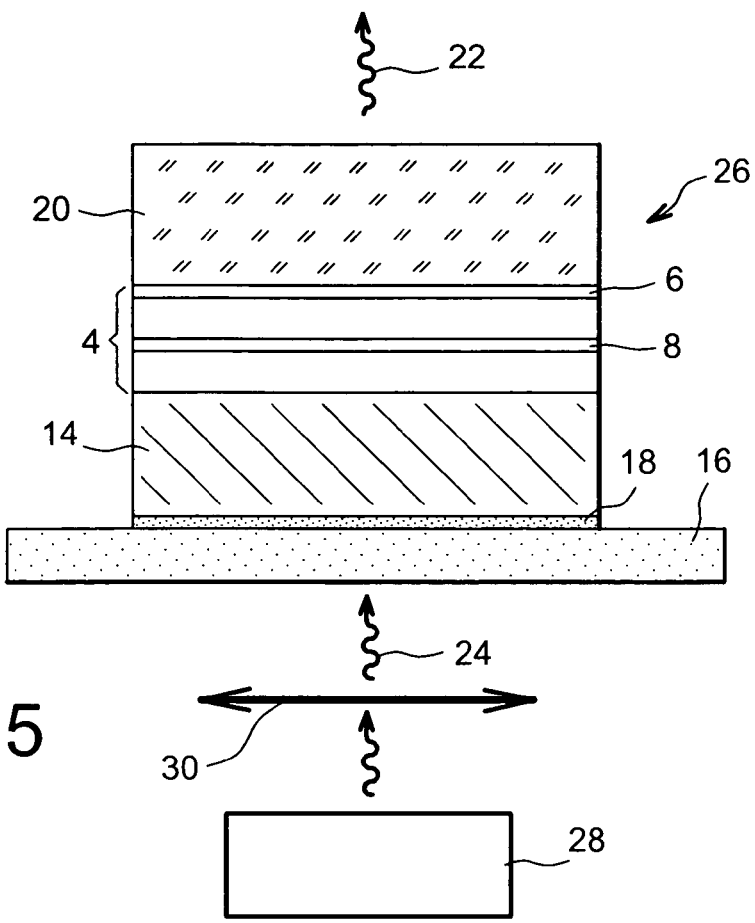

One then forms another Bragg mirror 20 called "output mirror" on the layer 6, by an appropriate deposition (FIG. 5).

The reflectivity of said mirror 20 is equal for example to 60% towards the radiation 22 emitted by the active part 4, in which the wavelength λ is for example 3.3 μm.

It should be pointed out that the reflectivity of the base mirror 14 is very low towards the optical pumping light 24 in which the wavelength equals for example 0.83 μm.

The emitting structure thus obtained, comprising a microcavity delimited by mirrors 14 and 20, constitutes a light emitting device 26 in accordance with the invention.

In order to make said device 26 operate, it is optically pumped by a laser diode 28 through the base mirror 14, either directly or via a focusing lens 30.

As regards the mirrors 14 and 20, it should be pointed out that the mirror 14 (respectively 20) is formed by deposition of a stack of elementary layers on the layer 12 (respectively 6).

Each of said elementary layers has a thickness equal to λ/(4n), λ and n being defined as above.

Moreover, in each stack, one alternates different elementary layers with each other so that each mirror is a stack of pairs of different elementary layers, each pair comprising for example a layer of $YF_3$ of 365 nm thickness and a layer of ZnS of 565 nm thickness.

The reflectivity of this type of mirror is an increasing function of the number of elementary layers.

As regards the mirror 14, in order to obtain a reflectivity of 98%, it is sufficient to stack 6 pairs of layers of the type $YF_3$ (365 nm)/ZnS (565 nm).

The invention is not limited to the generation of radiation in the infrared range.

It applies to the production of any micro-cavity light emitting device in which the emitting layer is formed of a material suited to acting also as an etching stop layer material.

In particular, we have described here above an example of the device in accordance with the invention comprising, on the substrate 2, the stack of layers 6, 10, 8 and 12. One thus obtains a device in accordance with the invention by forming such a stack (comprising a light emitting device between the first and second barrier layers and an etching stop layer between the substrate and the first barrier layer) in which the boundary layer is of the same nature as the emitting layer, for example in $Cd_xHg_{1-x}Te$.

We will now describe advantageous embodiments of the present invention.

The use of $Cd_xHg_{1-x}Te$ as emitting material imposes the use of an etching stop layer in HgTe. However, HgTe absorbs the photons that are present in the resonant cavity of a light emitting device thus obtained and, as a result, significantly reduces the output of the device. It is for this reason that, in accordance with the invention, one adds, to the HgTe material described above, cadmium in specific proportions that lead to the following unexpected results: the layer of $Cd_xHg_{1-x}Te$ becomes suited to forming an etching stop layer and said layer not only no longer absorbs the photons emitted but also participates in the emission of light.

We will now clarify what has been described, by first considering the problems posed by the prior art and then by explaining how one resolves these problems in advantageous embodiments of the present invention.

In order to produce a device that emits light in the mid infrared range, one uses CdHgTe as the emitting material. However, one needs to etch the substrate of the device and, as a result, an etching stop layer is necessary.

It is known that this type of etching stop layer may be formed of HgTe but it is also known that the use of said material leads to the reduction in the output of the device.

In fact, it is known that the forbidden band width of HgTe is zero. All light wavelengths are thus absorbed by HgTe.

In the present invention, one wishes preferably that all of the energy supplied by a pump laser (for example a pump laser diode), combined with a device structure in accordance with the invention, is absorbed by the structure.

However, the layer of HgTe, which is present in said structure, absorbs notably the photons in such a way that the output of the device decreases.

Figure 6:
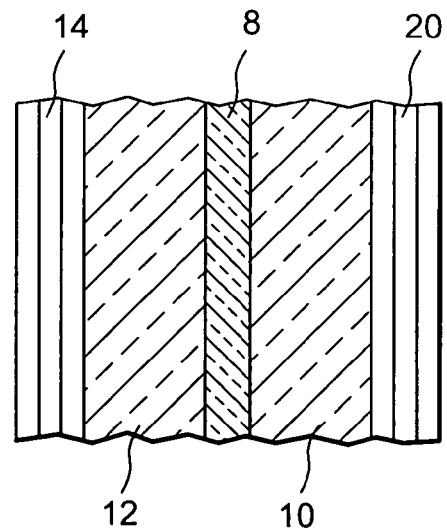
FIG. 6 is a schematic cross-sectional view of an example of a light emitting device according to the invention.

FIG. 6 is a very schematic cross-section of an example of a light emitting device in accordance with the invention. One can see the two mirrors 14 and 20 that delimit the resonant cavity of the device and, in said cavity, an emitting layer 8, for example in $Cd_xHg_{1-x}Te$, and two barrier layers 10 and 12, for example in $Cd_yHg_{1-y}Te$, which are respectively arranged on either side of the emitting layer 8. For the emitting layer 8, one has for example: $0.35<x<0.45$.

For the barrier layers, one chooses y greater than x and for example equal to 0.65 so that the material making up said layers is transparent to the photons.

Moreover, the cavity is calculated in such a way as to amplify the light emitted by the emitting layer.

However, one needs to place, against the mirror 20, an etching stop layer (not shown in FIG. 6) which, according to the prior art, would be in HgTe, a layer that would absorb the photons generated in the resonant cavity.

Furthermore, it is pointed out that one wishes to have as high a resonance as possible and thus a quality factor as close to 100 as possible. This results in a large number of photons going back and forth in the cavity. However, with each crossover, the layer of HgTe absorbs the photons. Therefore, the higher the desired quality factor, the higher the number of photons absorbed.

It should be pointed out that, in the present invention, one preferably wishes to have an etching stop layer that does not adversely affect the output of the device.

It is for this reason that in the present invention the etching stop layer and the emitting layer are both in $Cd_xHg_{1-x}Te$.

Thus, the authors of the present invention have found in a surprising manner that an emitting layer in $Cd_xHg_{1-x}Te$ may act as an etching stop layer (x being typically less than 0.50).

Moreover, they found in a surprising manner that the etching stop layer participates in the emission of light.

The invention claimed is:

1. Light emission device comprising a stack that comprises:
   a substrate;
   a combined etching stop and light emitting layer directly on said substrate;
   a first barrier layer directly on said combined etching stop and light emitting layer;
   a light emitting layer on said first barrier layer; and
   a second barrier layer on said light emitting layer,
   wherein the combined etching stop and light emitting layer and the light emitting layer comprise $Cd_xHg_{1-x}Te$, and x satisfies $0.1<x<0.5$.

2. Method for producing a micro-cavity light emitting device, said device including an active part delimited by first and second mirrors, the active part being formed on a substrate and including a combined etching stop and light emitting layer at an interface of the active part with a substrate, the combined etching stop and light emitting layer being directly in contact with the substrate, and an emitting layer also configured to emit light when the emitting layer is optically pumped by an optical pumping light through the first mirror, the method comprising:
   forming the first mirror on the active part;
   eliminating the substrate by etching; and
   forming the second mirror on the active part,
   wherein the emitting layer is made out of a material configured to emit light and to stop the etching and the combined etching stop and light emitting layer is made out of said material configured to emit light, and wherein said material comprises $Cd_xHg_{1-x}Te$, and x satisfies $0.1<x<0.5$.

3. Method according to claim 2, wherein the etching is a chemical etching.

4. Method according to claim 2, wherein the eliminating of the substrate further comprises a polishing of the substrate before the etching of the substrate.

5. Method according to claim 2, wherein the material of the emitting layer is chosen so that the light emitted by said emitting layer is an infrared radiation whose wavelength is in a range extending from 2 µm to 6 µm.

6. Method according to claim 2, wherein a thickness of the combined etching stop and light emitting layer is less than 50 nm.

7. Method according to claim 2, further comprising connecting the first mirror to a support layer transparent to the optical pumping light.

8. A light emission device according to claim 1, wherein said first and second barrier layers comprise $Cd_yHg_{1-y}Te$.

9. A light emission device according to claim 8, wherein y>x.

10. A light emission device according to claim 8, wherein a value of y is in a range between 0.6 and 1.

11. Method according to claim 2, wherein said active part has a thickness between $\lambda/2n$ and $10\lambda/2n$, wherein $\lambda$ is a wavelength of the emitted light and n is an average refractive index of said active part.

12. The light emission device according to claim 1, wherein the combined etching stop and light emitting layer and the light emitting layer are both made of a same material composition.

13. A micro-cavity light emission device comprising:
a first mirror,
a first barrier layer on said first mirror,
a first light emitting layer on said first barrier layer,
a second barrier layer on said first light emitting layer,
a second light emitting layer directly on said second barrier layer, and
a second mirror directly on said second light emitting layer,
wherein said first and second light emitting layers and said first and second barrier layers form an active part, said first and second mirrors delimiting the active part,
wherein said first and second light emitting layers comprise $Cd_xHg_{1-x}Te$, and x satisfies $0.1<x<0.5$.

14. The micro-cavity light emission device according to claim 13, wherein the first and second light emitting layers are both made of a same material composition.

15. A method for producing a micro-cavity light emitting device, the method comprising:

forming a combined etching stop and light emitting layer directly on a substrate, a first barrier layer directly on said combined etching stop and light emitting layer, a light emitting layer on said first barrier layer, a second barrier layer on said light emitting layer and a first mirror on said second barrier layer, eliminating the substrate by etching, and forming a second mirror on said combined etching stop and light emitting layer, wherein said light emitting device comprising said first mirror, said first barrier layer, said light emitting layer, said second barrier layer, said combined etching stop and light emitting layer and said second mirror, wherein said light emitting layer, said combined etching stop and light emitting layer, said first and second barrier layers forming an active part, said mirrors delimiting the active part, and wherein said light emitting layer and said combined etching stop and light emitting layer comprise $Cd_xHg_{1-x}Te$ and x satisfies $0.1<x<0.5$.

16. The method according to claim 15, wherein the combined etching stop and light emitting layer and the light emitting layer are both made of a same material composition.

* * * * *